(12) United States Patent
Li et al.

(10) Patent No.: US 9,287,178 B2
(45) Date of Patent: Mar. 15, 2016

(54) MULTI-GATE FIELD EFFECT TRANSISTOR (FET) INCLUDING ISOLATED FIN BODY

(71) Applicant: GLOBALFOUNDRIES INC., Grand Cayman (KY)

(72) Inventors: Hongmei Li, Williston, VT (US); Junjun Li, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 324 days.

(21) Appl. No.: 13/632,237

(22) Filed: Oct. 1, 2012

(65) Prior Publication Data

US 2014/0091394 A1    Apr. 3, 2014

(51) Int. Cl.
| H01L 21/20 | (2006.01) |
| H01L 21/8234 | (2006.01) |
| H01L 27/088 | (2006.01) |
| H01L 29/66 | (2006.01) |
| H01L 29/78 | (2006.01) |

(52) U.S. Cl.
CPC .... H01L 21/823431 (2013.01); H01L 27/0886 (2013.01); H01L 29/66795 (2013.01); H01L 29/7853 (2013.01)

(58) Field of Classification Search
None
See application file for complete search history.

(56) References Cited

U.S. PATENT DOCUMENTS

| 7,176,481 | B2 | 2/2007 | Chen et al. | |
| 7,531,879 | B2 | 5/2009 | Chang | |
| 7,736,956 | B2 | 6/2010 | Datta et al. | |
| 7,973,389 | B2 | 7/2011 | Rios et al. | |
| 8,703,565 | B2 | 4/2014 | Chang et al. | |
| 8,957,477 | B2 * | 2/2015 | Chang et al. | 257/347 |
| 2005/0170593 | A1 | 8/2005 | Kang et al. | |
| 2009/0278196 | A1 * | 11/2009 | Chang et al. | 257/328 |
| 2010/0248454 | A1 * | 9/2010 | Maszara et al. | 438/478 |
| 2011/0147846 | A1 | 6/2011 | Su et al. | |
| 2011/0260298 | A1 | 10/2011 | Lee et al. | |
| 2011/0298050 | A1 * | 12/2011 | Luo et al. | 257/347 |
| 2012/0040517 | A1 | 2/2012 | Maszara et al. | |
| 2012/0086053 | A1 | 4/2012 | Tseng et al. | |
| 2013/0020640 | A1 * | 1/2013 | Chen et al. | 257/347 |

OTHER PUBLICATIONS

Hwang et al., "20nm Gate Bulk-FinFET SONOS Flash," Electron Devices Meeting, 2005. IEDM Technical Digest. IEEE International (4 pages).

Ohta et al., "High performance 30 nm gate bulk CMOS for 45 nm node with Σ-shaped SiGe-Sd," Electron Devices Meeting, 2005. IEDM Technical Digest. IEEE International (4 pages).

* cited by examiner

Primary Examiner — Matthew W Such
Assistant Examiner — Abul Kalam
(74) Attorney, Agent, or Firm — Michael Le Strange; Hoffman Warnick LLC

(57) ABSTRACT

Aspects of the disclosure provide a multi-gate field effect transistor (FET) formed on a bulk substrate that includes an isolated fin and methods of forming the same. In one embodiment, the multi-gate FET includes: a plurality of silicon fin structures formed on the bulk substrate, each silicon fin structure including a body region, a source region, and a drain region; wherein a bottom portion the body region of each silicon fin structure includes a tipped shape to isolate the body region from the bulk substrate, and wherein the plurality of silicon fin structures are attached to the bulk substrate via at least a portion of the source region, or at least a portion of the drain region, or both.

14 Claims, 12 Drawing Sheets

MULTI-GATE FIELD EFFECT TRANSISTOR (FET) INCLUDING ISOLATED FIN BODY

FIELD OF THE INVENTION

The disclosure relates generally to semiconductor devices, and more particularly, to a multi-gate field effect transistor (FET) formed on a bulk substrate that includes an isolated fin structure and methods of forming the same.

BACKGROUND

In manufacturing multi-gate field effect transistors (FETs) that include a plurality of fin structures (i.e., a FinFET), in order to operate properly, the fin structures must be isolated from the substrate if the FET is built on a bulk substrate. In contrast, a FinFET built on a silicon-on-insulator (SOI) substrate includes a buried oxide layer (BOX) that isolates the fin structures from each other and the substrate.

Various attempts have been made to isolate the fin structures from the substrate for FinFETs built on bulk substrates. For example, a high dose junction implant at the base of each fin may isolate the fin from the bulk substrate. Alternatively, oxide is grown across the bottom of each fin structure. However, the viability of each of these attempts in manufacturing the FinFETs on a bulk substrate is unknown and may be costly.

BRIEF SUMMARY

Aspects of the disclosure provide a multi-gate field effect transistor (FET) formed on a bulk substrate that includes an isolated fin and methods of forming the same. In one embodiment, the multi-gate FET includes: a plurality of silicon fin structures formed on the bulk substrate, each silicon fin structure including a body region, a source region, and a drain region; wherein a bottom portion the body region of each silicon fin structure includes a tipped shape to isolate the body region from the bulk substrate, and wherein the plurality of silicon fin structures are attached to the bulk substrate via at least a portion of the source region, or at least a portion of the drain region, or both.

A first aspect of the disclosure provides a multi-gate field effect transistor (FET) formed on a bulk substrate, comprising: a plurality of silicon fin structures formed on the bulk substrate, each silicon fin structure including a body region, a source region, and a drain region; wherein a bottom portion the body region of each silicon fin structure includes a tipped shape to isolate the body region from the bulk substrate, and wherein the plurality of silicon fin structures are attached to the bulk substrate via at least a portion of the source region, or at least a portion of the drain region.

A second aspect of the disclosure provides a method of fabricating a multi-gate field effect transistor (FET) in a bulk substrate manufacturing process, the method comprising: forming a plurality of silicon fin structures on a bulk substrate; depositing an oxide layer on the bulk substrate; removing a portion of the oxide layer, such that a first sidewall portion of each silicon fin structure is exposed; depositing a nitride spacer along the first exposed sidewall portion of each silicon fin structure; removing a remaining portion of the oxide layer, such that a second sidewall portion of each silicon fin structure below the nitride spacer is exposed; performing a plurality of etches, such that a bottom portion of a body region of each silicon fin structure includes a tipped shape; and depositing an oxide between the body region of each silicon fin structure and the bulk substrate to isolate the body region of each silicon fin structure from the bulk substrate.

A third aspect of the disclosure provides a method of fabricating a multi-gate field effect transistor (FET) in a bulk substrate manufacturing process, the method comprising: forming a plurality of silicon fin structures on a bulk substrate; depositing an oxide layer on the bulk substrate; removing a portion of the oxide layer, such that a first sidewall portion of each silicon fin structure is exposed; depositing a nitride spacer along the first exposed sidewall portion of each silicon fin structure; removing a remaining portion of the oxide layer, such that a second sidewall portion of each silicon fin structure below the nitride spacer is exposed; performing an isotropic reactive ion etching to etch a curved portion of the second sidewall portion of each silicon fin structure; performing a sigma silicon wet etch, such that a bottom portion of a body region of each silicon fin structure includes a tipped shape and a portion of the bulk substrate directly below the body region of each silicon fin structure includes a corresponding tipped shape; and depositing an oxide between the body region of each silicon fin structure and the bulk substrate to isolate the body region of each silicon fin structure from the bulk substrate.

BRIEF DESCRIPTION OF THE DRAWINGS

The above and other aspects, features and advantages of the disclosure will be better understood by reading the following more particular description of the disclosure in conjunction with the accompanying drawings.

Figure 1:
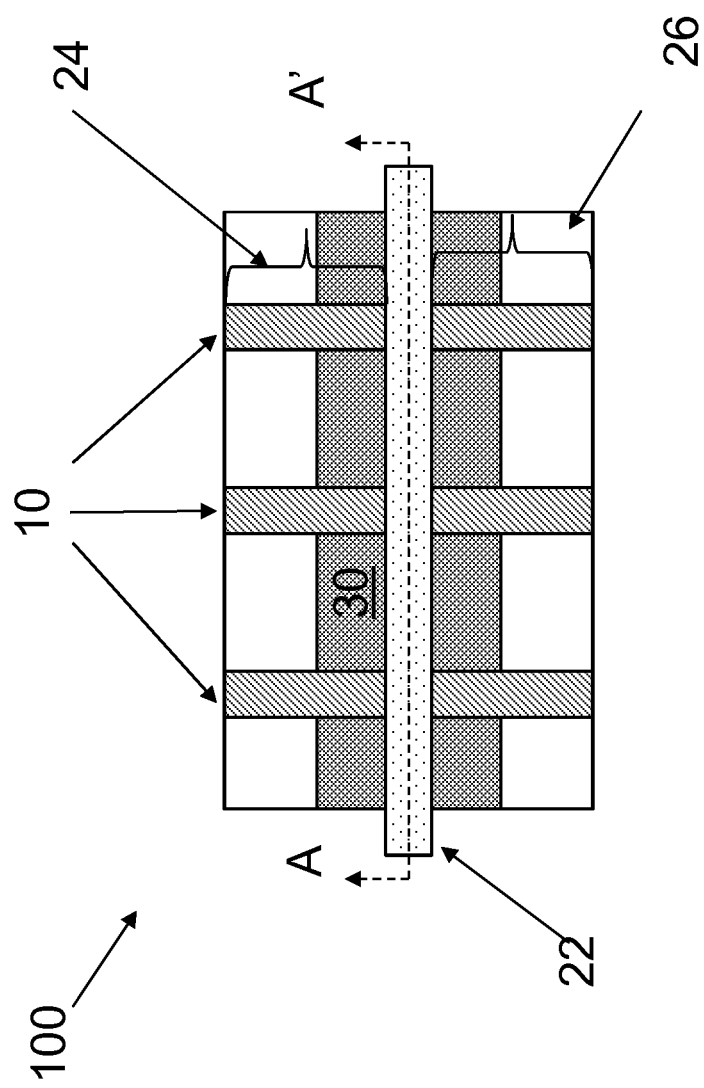
FIG. 1 shows a top view of a multi-gate FET according to embodiments of the invention.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

As mentioned above, the disclosure relates generally to semiconductor devices, and more particularly, to a multi-gate field effect transistor (FET) formed on a bulk substrate that includes an isolated fin structure and methods of forming the same.

In manufacturing multi-gate field effect transistors (FETs) that include a plurality of fin structures (i.e., a FinFET), in order to operate properly, the fin structures must be isolated from the substrate if the FET is built on a bulk substrate. In contrast, a FinFET built on a silicon-on-insulator (SOI) substrate includes a buried oxide layer (BOX) that isolates the fin structures from each other and the substrate.

Various attempts have been made to isolate the fin structures from the substrate for FinFETs built on bulk substrates. For example, a high dose junction implant at the base of each fin may isolate the fin from the bulk substrate. Alternatively, oxide is grown across the bottom of each fin structure. However, the viability of each of these attempts in manufacturing the FinFETs on a bulk substrate is unknown and may be costly.

Aspects of the disclosure provide a multi-gate field effect transistor (FET) formed on a bulk substrate that includes an isolated fin and methods of forming the same. In one embodiment, the multi-gate FET includes: a plurality of silicon fin structures formed on the bulk substrate, each silicon fin structure including a body region, a source region, and a drain region; wherein a bottom portion the body region of each silicon fin structure includes a tipped shape to isolate the body region from the bulk substrate, and wherein the plurality of silicon fin structures are attached to the bulk substrate via at least a portion of the source region, or at least a portion of the drain region, or both. Therefore, the body of each fin structure is effectively isolated from the bulk substrate. In the following descriptions, the exemplary figures show both source and drain regions attached to the bulk substrate.

Figure 2:
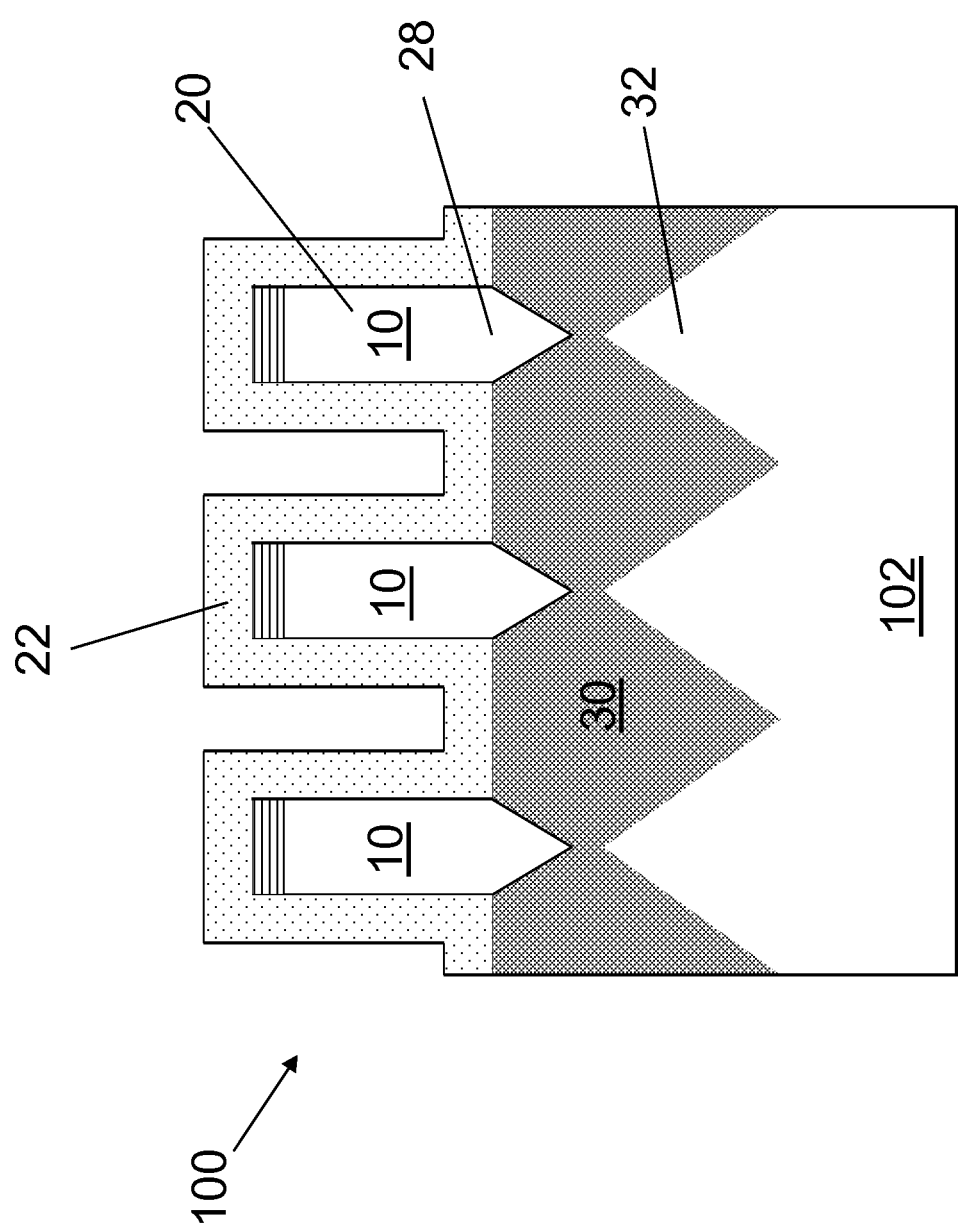
FIG. 2 shows a partial cross-sectional view of a multi-gate FET according to embodiments of the invention.

Turning now to FIG. 1, a top view of a multi-gate FET 100 according to embodiments of the invention. FIG. 2 shows a partial cross-sectional view of multi-gate FET 100 according to embodiments of the invention, along cut A-A shown in FIG. 1. Multi-gate FET 100, also known as a FinFET, is formed on a bulk substrate 102. A plurality of silicon fin structures 10 are formed on the bulk substrate 102.

The plurality of silicon fin structures 10 each include a body region 20 that is directly below gate 22. A source region 24 and a drain region 26 of silicon fin structure 10 are adjacent to body region 20 (only shown in FIG. 2). Source region 24 and drain region 26 are only shown in FIG. 1. A bottom portion 28 of body region 20 includes a tipped shape that isolates body region 20 of each silicon fin structure 10 from the bulk substrate 102. An oxide layer 30 isolates the body region 20 from the bulk substrate 102.

However, it is understood that the plurality of fin structures 10 remain attached to the bulk substrate 102 via at least a portion of the source region 24, or at least a portion of the drain region 26, or both. That is, in one embodiment, only the body region 20 may be isolated from the bulk substrate 102. However, as seen in FIG. 1, in addition to isolating the body region 20 (under gate 22), oxide layer 30 may also isolate a portion of the source region 24 and the drain region 26 of each silicon fin structure 10 from the bulk substrate 102. Alternatively, either the source region 24 or the drain region 26 may be partially isolated form the bulk substrate 102.

As seen in FIG. 2, a portion 32 of the bulk substrate 102 that is directly below each tipped portion 28 of each body region 20 includes a corresponding tipped shape. However, in an alternative embodiment of a multi-gate FET 200 shown in FIG. 12, a portion 50 of bulk substrate 102 that is between the tipped portions 28 of each body region 20 includes a corresponding tipped shape.

Figure 3:
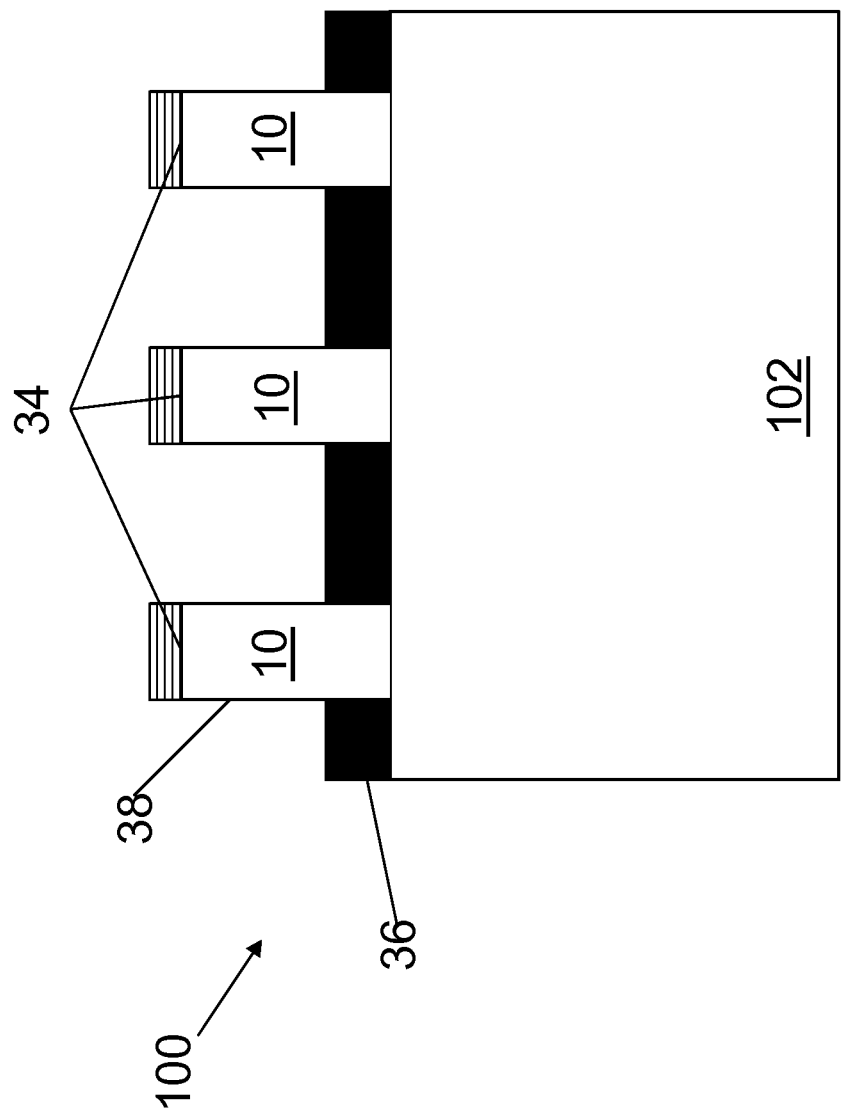
FIG. 3 shows a partial cross-sectional view of a multi-gate FET according to embodiments of the invention.

Turning now to FIGS. 3-9, partial cross-sectional views for a method of fabricating a multi-gate FET 100, as shown in FIGS. 1-2 in a bulk substrate manufacturing process, are shown. In FIG. 3, a plurality of silicon fin structures 10 are formed on the bulk substrate 102. Although the process steps to form the plurality of silicon fin structures 10 on the bulk substrate 102 are not shown in the figures, it is understood that, a hard mask is formed over the bulk substrate and a photo resist is applied over the hard mask in the locations of each silicon fin structure 10. The bulk substrate is etched to form a plurality of trenches between each silicon fin structure 10. The hard mask (i.e., nitride cap layer 34) remains over each silicon fin structure 10. An oxide layer 36 is deposited and a chemical mechanical polish (CMP) is performed on the oxide layer 36. A timed etch is performed on the oxide layer 36, such that the oxide layer 36 is below the nitride cap layer 34. That is, a first sidewall portion 38 of each silicon fin structure 10 is exposed.

Figure 4:
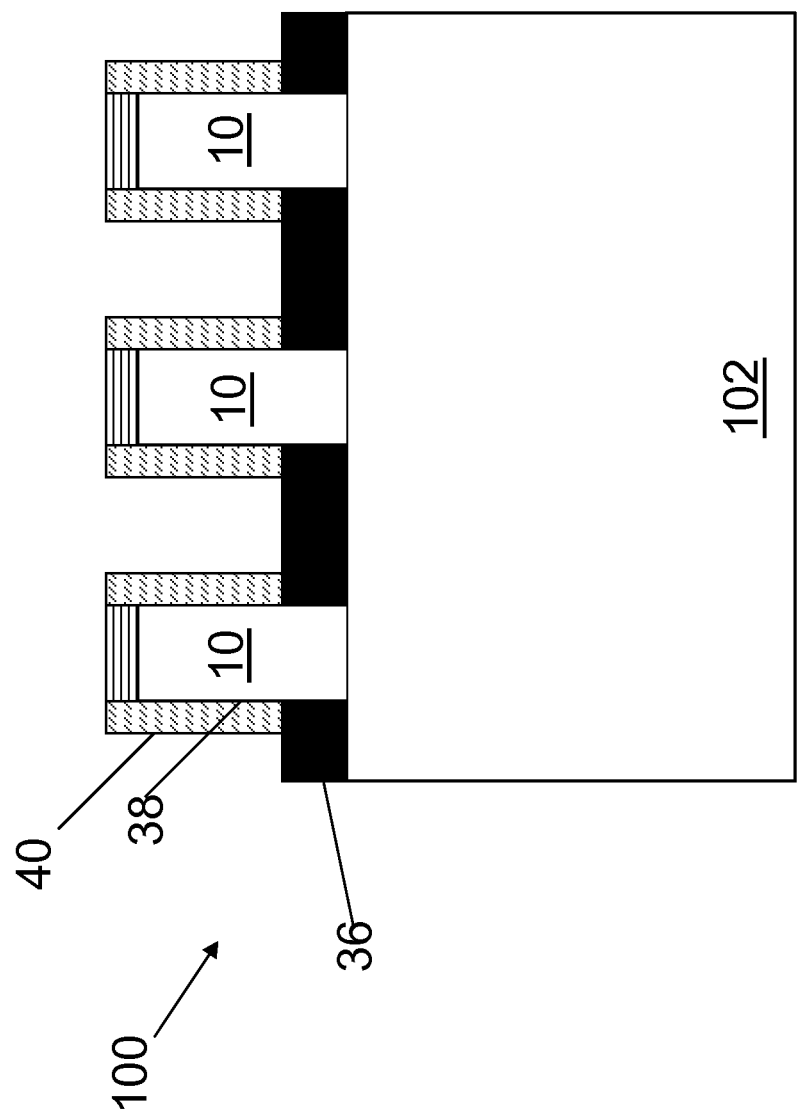
FIG. 4 shows a partial cross-sectional view of a multi-gate FET according to embodiments of the invention.
Figure 5:
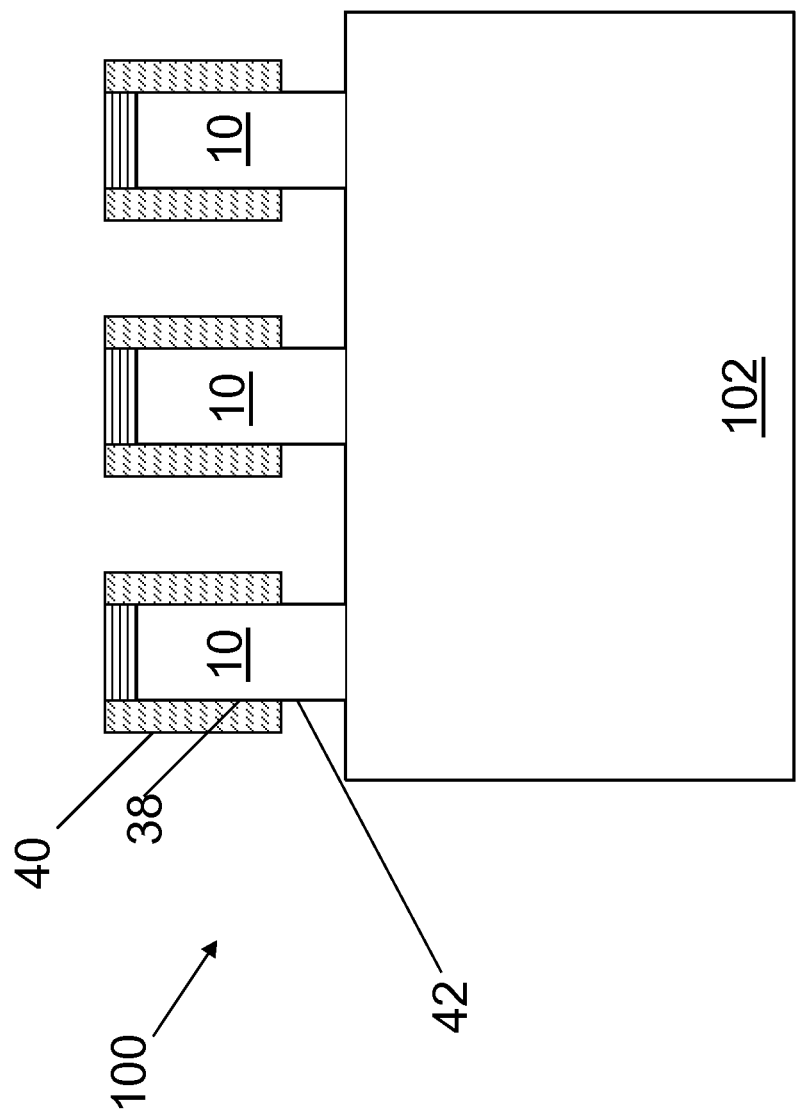
FIG. 5 shows a partial cross-sectional view of a multi-gate FET according to embodiments of the invention.

Turning now to FIG. 4, a nitride spacer 40 is deposited along each exposed sidewall portion 38 of each silicon fin structure 10. Next, as seen in FIG. 5, the oxide layer 36 is removed, such that a second sidewall portion 42 that is below the nitride spacer 40 is exposed.

Figure 6:
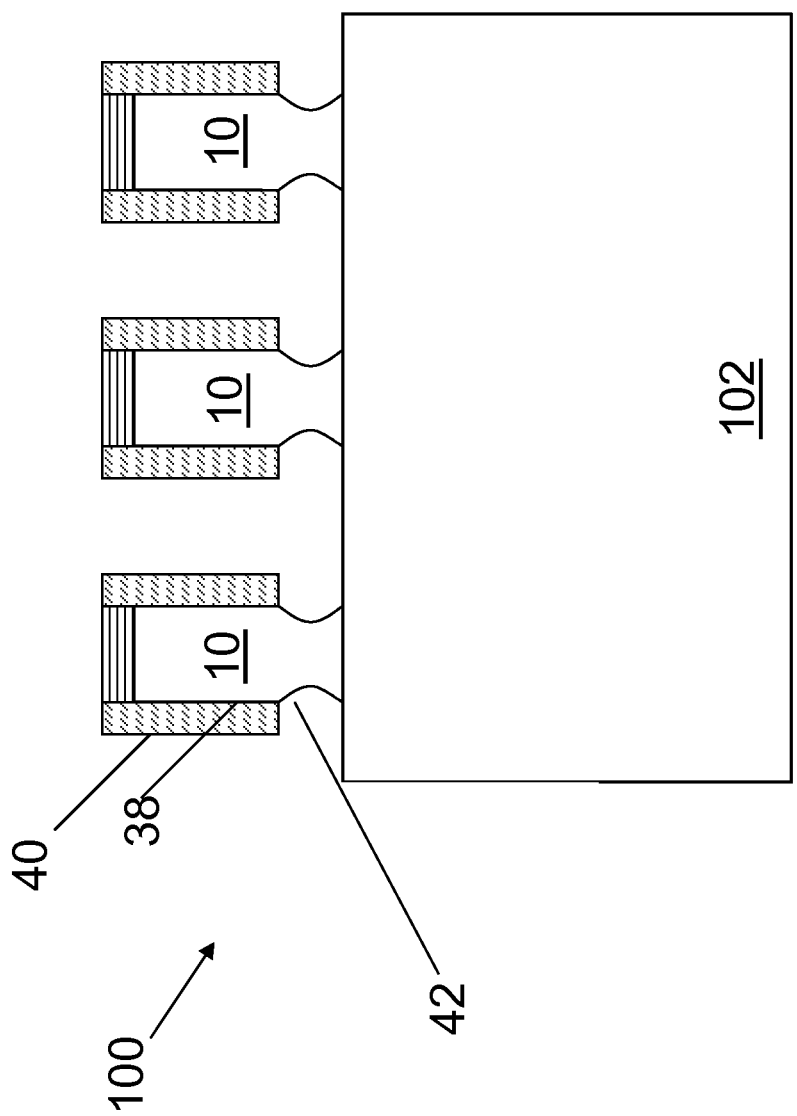
FIG. 6 shows a partial cross-sectional view of a multi-gate FET according to embodiments of the invention.
Figure 7:
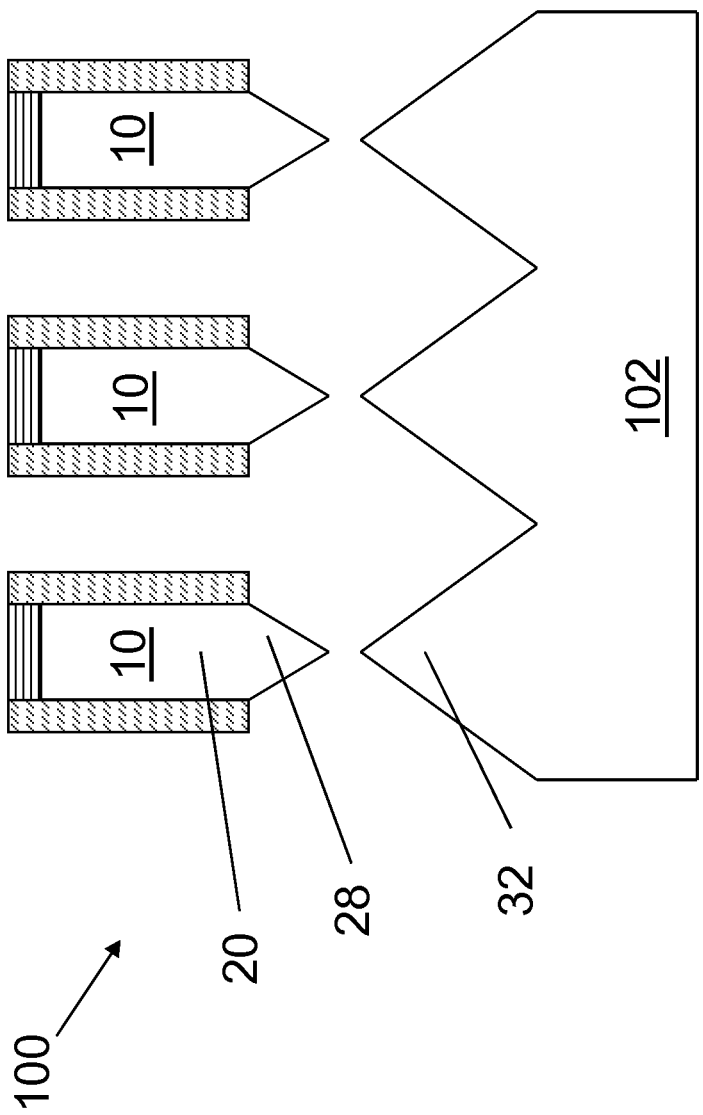
FIG. 7 shows a partial cross-sectional view of a multi-gate FET according to embodiments of the invention.

Next, turning to FIGS. 6-7, a plurality of etches are performed so that a bottom portion 28 of the body region 20 of each silicon fin structure 10 includes a tipped shape. For example, in FIG. 6, the bottom portion 28 of the body region 20 is patterned prior to performing the plurality of etches. The plurality of etches may include, for example, an isotropic reactive ion etching (RIE) to etch the second sidewall portion 42 of each silicon fin structure 10 into a curved shape. Next, in FIG. 7, a sigma silicon wet etch is performed, such that the bottom portion 28 of the body region 20 includes a tipped shape. Further, a portion 32 of bulk substrate 102 that is directly below body region 20 includes a corresponding tipped shape.

Figure 8:
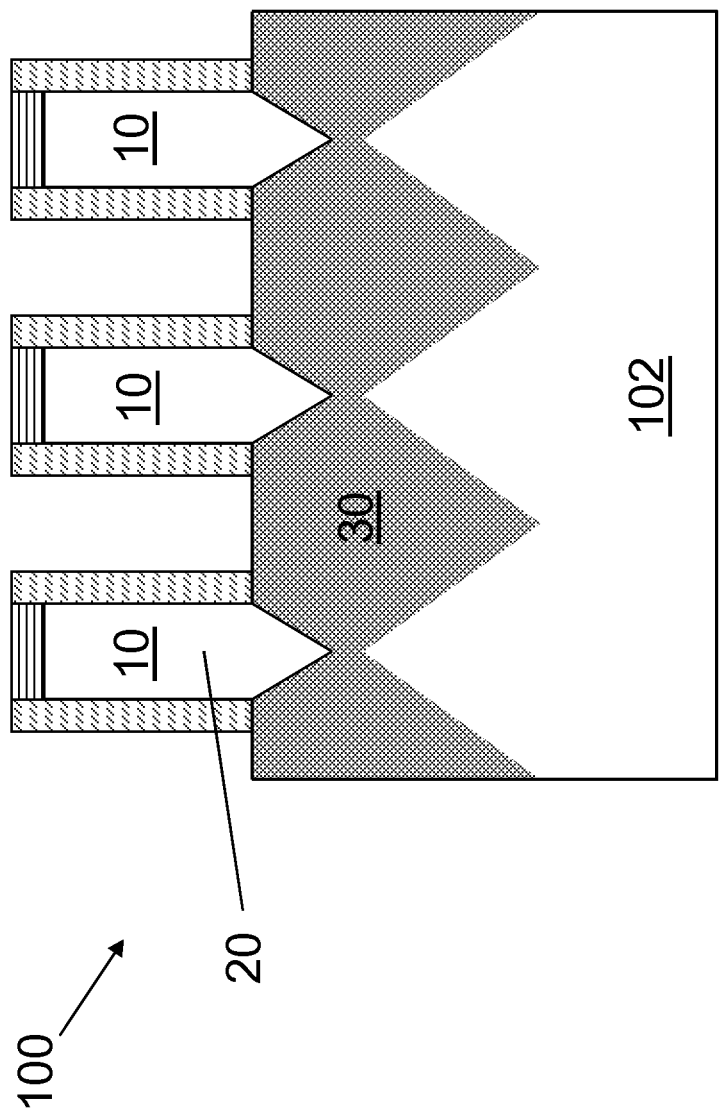
FIG. 8 shows a partial cross-sectional view of a multi-gate FET according to embodiments of the invention.
Figure 9:
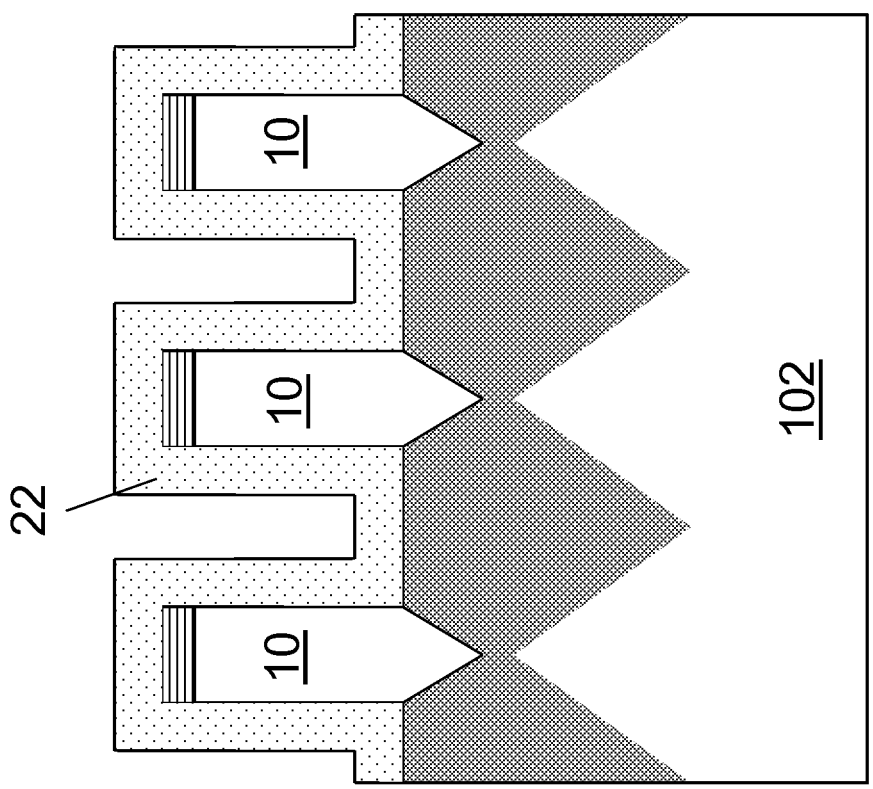
FIG. 9 shows a partial cross-sectional view of a multi-gate FET according to embodiments of the invention.

Turning now to FIG. 8, an oxide layer 30 is deposited between the plurality of fin structures 10 and the bulk substrate 102. That is, the body region 20 of each silicon fin structure 10 is isolated from the bulk substrate 102. Further processing steps include, in FIG. 9, removing the nitride spacer 40. Also, a gate 22 may be formed over each silicon fin structure 10.

Figure 10:
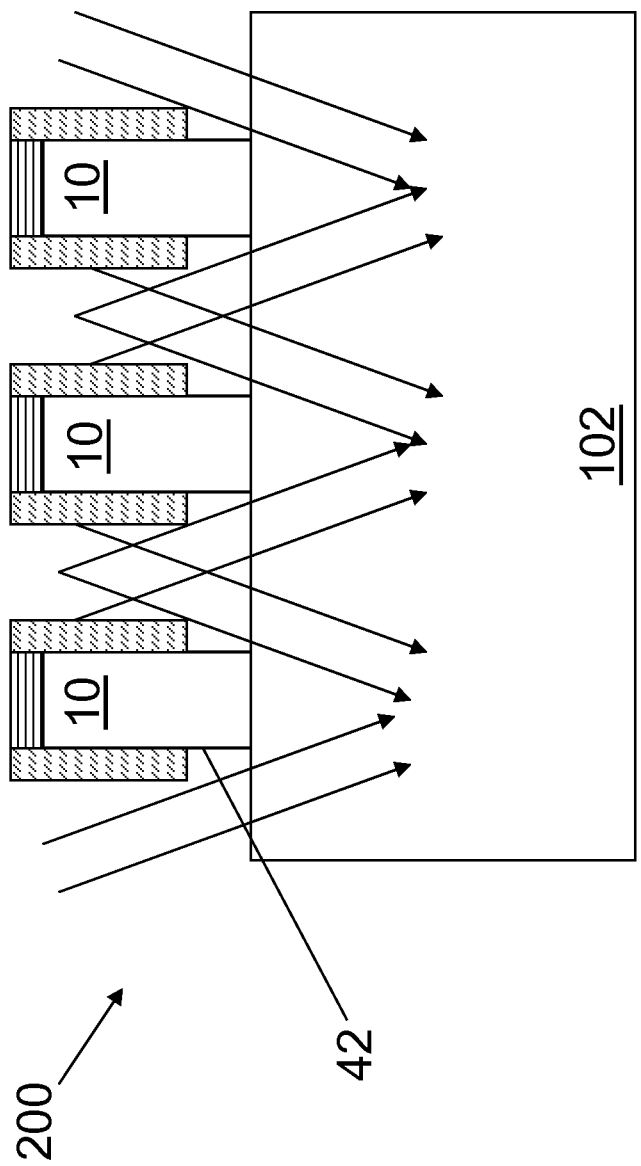
FIG. 10 shows a partial cross-sectional view of a multi-gate FET according to embodiments of the invention.
Figure 11:
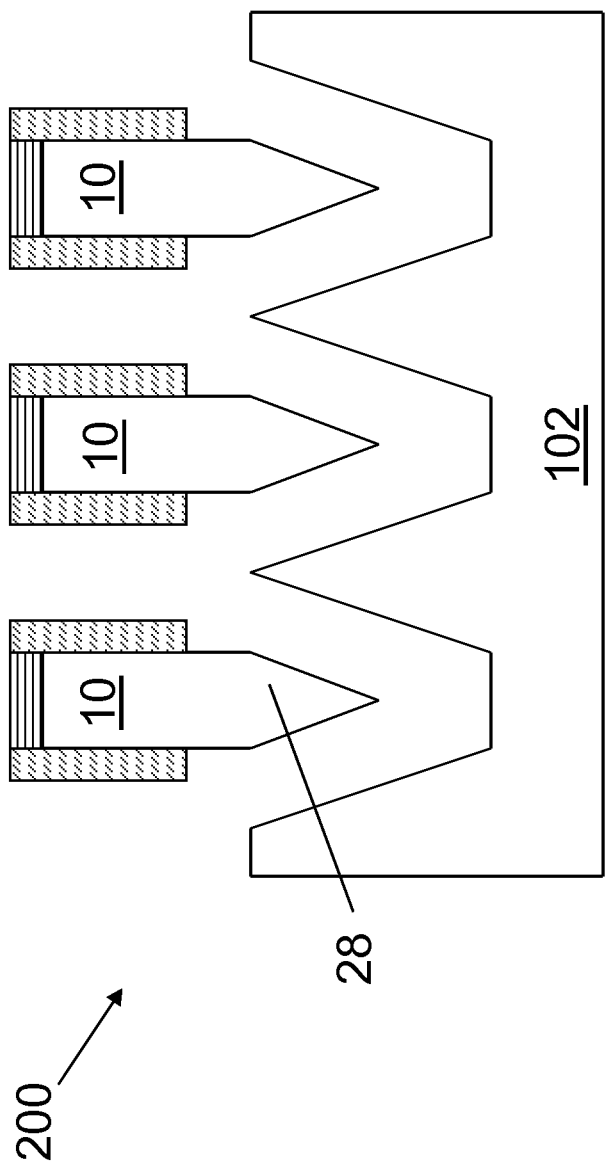
FIG. 11 shows a partial cross-sectional view of a multi-gate FET according to embodiments of the invention.
Figure 12:
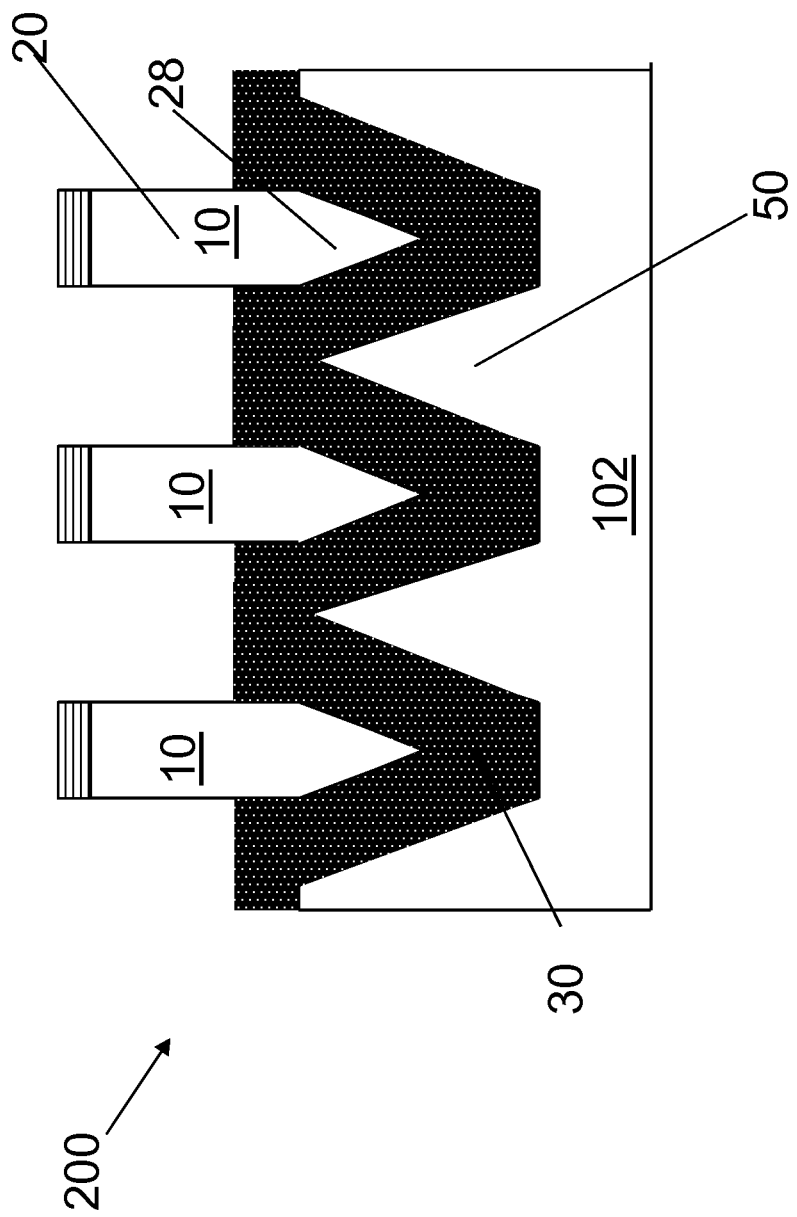
FIG. 12 shows a partial cross-sectional view of a multi-gate FET according to embodiments of the invention.

Turning now to FIG. 10, an alternative embodiment of the plurality of etches to fabricate multi-gate FET 200 (FIG. 12) may include performing an angled deep reactive ion etching (RIE) to a portion of the second sidewall portion 42 of each silicon fin structure 10. Next, in FIG. 11, an anisotropic dry etch is performed, such that the bottom portion 28 of each silicon fin structure 10 includes a tipped shape. Further, a portion 50 of bulk substrate 102 that is between each silicon fin structure 10 includes a corresponding tipped shape. Next, as shown in FIG. 12, an oxide layer 30 may be deposited between the plurality of silicon fin structures 10 and bulk substrate 102. In this way, the body region 20 of each silicon fin structure 10 is effectively isolated from the bulk substrate 102.

Returning back to FIG. 7, an alternative embodiment may exclude the oxide deposition, as shown in FIG. 8. In this embodiment, the body region 20 may be effectively isolated from the bulk substrate 102 via vacuum or air.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of fabricating a multi-gate field effect transistor (FET) in a bulk substrate manufacturing process, the method comprising:
   forming a plurality of silicon fin structures on a bulk substrate;
   depositing an oxide layer on the bulk substrate;
   removing a portion of the oxide layer, such that a first sidewall portion of each silicon fin structure is exposed;
   depositing a nitride spacer along the first exposed sidewall portion of each silicon fin structure;
   removing a remaining portion of the oxide layer, such that a second sidewall portion of each silicon fin structure below the nitride spacer is exposed;
   performing a plurality of etches, such that a bottom portion of a body region of each silicon fin structure includes a tipped shape; and
   depositing an oxide between the body region of each silicon fin structure and the bulk substrate to isolate the body region of each silicon fin structure from the bulk substrate;
   wherein a portion of the bulk substrate between each silicon fin structure includes a tipped shape;
   wherein performing the plurality of etches comprises:
      performing an angled deep reactive ion etching to a portion of the second sidewall portion of each silicon fin structure; and
      performing an anisotropic dry etch to form the tipped shape of the bottom portion of the body region of each silicon fin structure and to form the tipped shape of the portion of the bulk substrate between each silicon fin structure.

2. The method of claim 1, further comprising patterning a region prior to performing the plurality of etches.

3. The method of claim 1, further comprising removing the nitride spacer.

4. The method of claim 2, further comprising forming a gate over each silicon fin structure.

5. The method of claim 1, wherein at least one of: a source region and a drain region of each silicon fin structure is partially isolated from the bulk substrate.

6. A method of fabricating a multi-gate field effect transistor (FET) in a bulk substrate manufacturing process, the method comprising:
   forming a plurality of silicon fin structures on a bulk substrate;
   depositing an oxide layer on the bulk substrate;
   removing a portion of the oxide layer, such that a first sidewall portion of each silicon fin structure is exposed;
   depositing a nitride spacer along the first exposed sidewall portion of each silicon fin structure;
   removing a remaining portion of the oxide layer, such that a second sidewalk portion of each silicon fin structure below the nitride spacer is exposed;
   performing an isotropic reactive ion etching to etch a curved portion of the second sidewall portion of each silicon fin structure;
   performing a sigma silicon wet etch, such that a bottom portion of a body region of each silicon fin structure includes a tipped shape and a portion of the bulk substrate directly below the body region of each silicon fin structure includes a corresponding tipped shape; and
   depositing an oxide between the body region of each silicon fin structure and the bulk substrate to isolate the body region of each silicon fin structure from the bulk substrate.

7. The method of claim 6, further comprising removing the nitride spacer.

8. The method of claim 7, further comprising forming a gate over each silicon fin structure.

9. The method of claim 6, wherein a source region of each silicon fin structure is partially isolated from the bulk substrate.

10. The method of claim 6, wherein a drain region of each silicon fin structure is partially isolated from the bulk substrate.

11. A method of fabricating a multi-gate field effect transistor (FET) in a bulk substrate manufacturing process, the method comprising:
   forming a plurality of silicon fin structures on a bulk substrate;
   depositing an oxide layer on the bulk substrate;
   removing a portion of the oxide layer, such that a first sidewall portion of each silicon fin structure is exposed;
   depositing a nitride spacer along the first exposed sidewall portion of each silicon fin structure;
   removing a remaining portion of the oxide layer, such that a second sidewall portion of each silicon fin structure below the nitride spacer is exposed;
   performing a plurality of etches, such that a bottom portion of a body region of each silicon fin structure includes a tipped shape; and
   depositing an oxide between the body region of each silicon fin structure and the bulk substrate to isolate the body region of each silicon fin structure from the bulk substrate;
   wherein the performing a plurality of etches comprises:
      performing an angled deep reactive ion etching on the second sidewall portion of each silicon fin structure; and
      performing an anisotropic dry etch, such that the bottom portion of the body region of each silicon fin structure includes a tipped shape and a portion of the bulk substrate between each silicon fin structure includes a tipped shape.

12. The method of claim 11, further comprising removing the nitride spacer.

13. The method of claim 11, further comprising forming a gate over each silicon fin structure.

14. The method of claim 11, wherein at least one of a source region and a drain region of each silicon fin structure is partially isolated from the bulk substrate.

* * * * *